United States Patent
Arai et al.

(10) Patent No.: US 6,201,373 B1
(45) Date of Patent: Mar. 13, 2001

(54) BATTERY REMAINING CAPACITY MEASURING APPARATUS SUITABLE FOR HYBRID CAR

(75) Inventors: Youchi Arai; Tsutomu Saigo; Michito Enomoto, all of Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/556,688

(22) Filed: Apr. 21, 2000

(30) Foreign Application Priority Data

May 26, 1999 (JP) .................................................. 11-147201

(51) Int. Cl.$^7$ .................................................. H01M 10/46
(52) U.S. Cl. .................................................. 320/132
(58) Field of Search .................................... 320/132, 149; 324/426, 427, 428, 433; 429/90

(56) References Cited

U.S. PATENT DOCUMENTS

| | | |
|---|---|---|
| 5,561,362 | * 10/1996 | Kawamura et al. . |
| 5,617,324 | * 4/1997 | Arai . |
| 5,698,983 | * 12/1997 | Arai et al. . |
| 5,703,486 | * 12/1997 | Arai et al. . |
| 5,789,923 | * 8/1998 | Shimoyama et al. . |
| 5,798,934 | * 8/1998 | Saigo et al. . |
| 5,898,292 | * 4/1999 | Takemoto et al. . |

FOREIGN PATENT DOCUMENTS

| | | |
|---|---|---|
| P 8-62310 | 3/1996 | (JP) . |
| P 10-246760 | 9/1998 | (JP) . |

* cited by examiner

Primary Examiner—Edward H. Tso
(74) Attorney, Agent, or Firm—Finnegan, Henderson, Farabow, Garrett & Dunner, L.L.P.

(57) ABSTRACT

A remaining capacity measuring apparatus of this invention operates as follows. A current value and a voltage value from a current sensor and a voltage sensor respectively provided in a battery connected to a hybrid mechanism portion are sampled every 1 millisecond. Each time when eight pairs (N1) of this current value data and voltage value data are collected, the current values and voltage values are each averaged. When 100 pairs (N2) of the average current values and the average voltage values are obtained, the 100 pair data are plotted on a voltage-current coordinate system. A correlation between the current and voltage is obtained based on the plural data plotted on this coordinate system. When a strong negative correlation is indicated, an approximate line indicating a relation between the voltage and current is obtained. By substituting a predetermined current value for this line, a voltage value is defined and a value corresponding to this voltage value is regarded as a current remaining capacity.

5 Claims, 7 Drawing Sheets

BATTERY REMAINING CAPACITY MEASURING APPARATUS SUITABLE FOR HYBRID CAR

BACKGROUND OF THE INVENTION

1. Field of the Invention

The present invention relates to a battery remaining capacity measuring apparatus, more particularly to a battery remaining capacity measuring apparatus wherein the quantity of collected samples for battery current and voltage and the quantity of samples for obtaining averages thereof are determined depending on a discharging time of the battery.

2. Description of the Related Art

Figure 7:
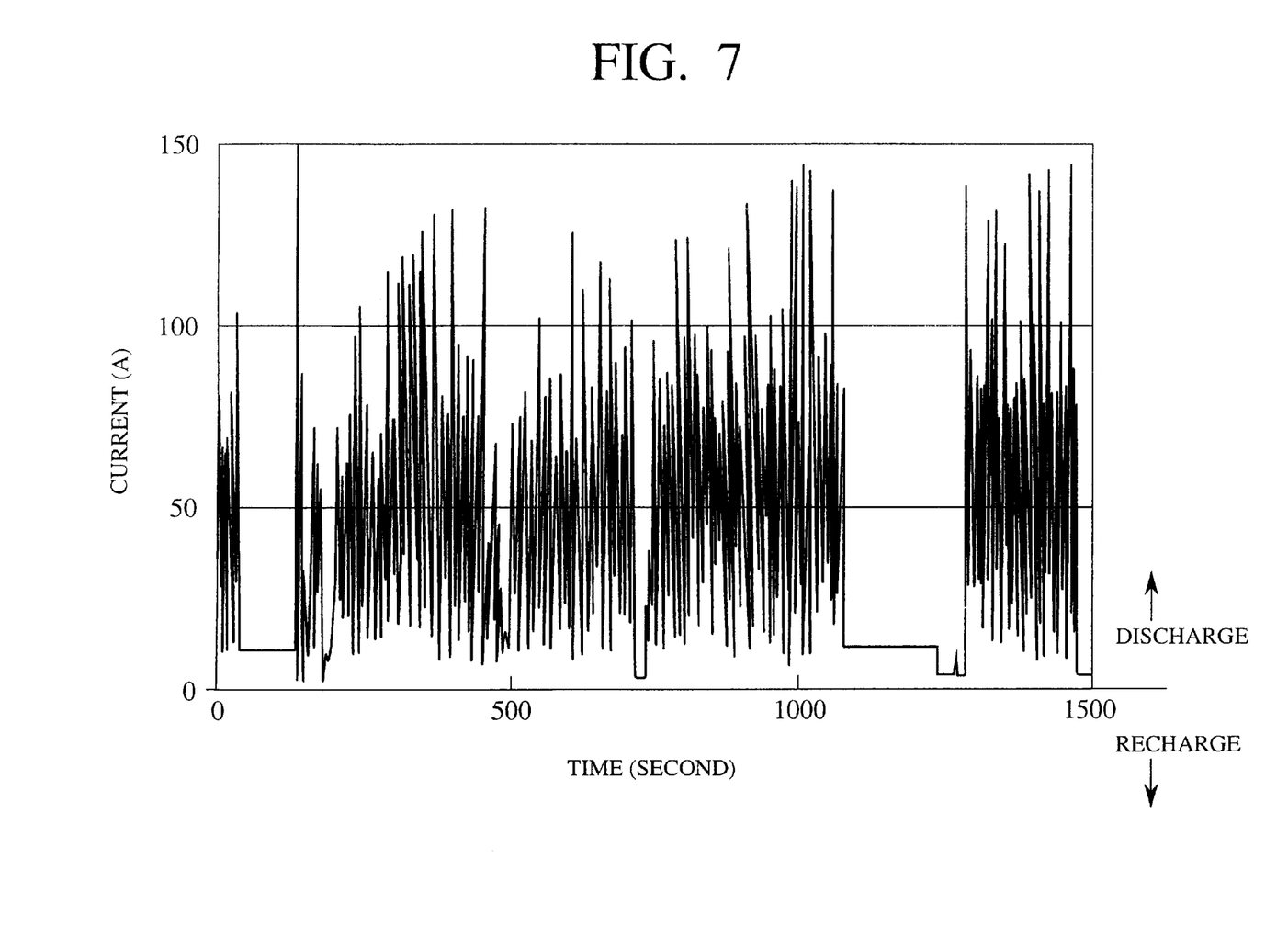
FIG. 7 is a wave form diagram for explaining charge and discharge of the battery of an electric vehicle.

Generally, measurement of the battery remaining capacity of an electric automobile is premised that discharge is continued for at shortest 10 seconds as shown in FIG. 7 by keeping an accelerator pressed, as described in Japanese Patent Application Laid-Open No.H8-62310.

In the battery remaining capacity measuring apparatus disclosed in Japanese Patent Application Laid-Open No.H8-62310, discharge current I and voltage V from the battery are sampled every 1 millisecond, and each time when 100 units (N1) of this current value and voltage value of 1 millisecond are collected, those values are averaged so as to obtain average data. When 100 units (N2) of this average data (N1×N2=10000) are obtained, a correlation between current and voltage is obtained. When a strong negative correlation is indicated, an approximate line (Y=a·X+b Y: current, X: voltage) is obtained based on the 100 average data. Then, by substituting a specified value for Y in this equation, the voltage X is specified so as to regard this voltage as current remaining capacity. That is, the remaining capacity is obtained based on data obtained by measuring for 10 seconds.

Because the quantity of data is very massive, even when current data in a charging direction for a short time exists, this can be buried as an error.

However, recently, a high voltage vehicle called hybrid car or simple hybrid car has been used which contains two kinds of driving sources, namely an engine and a DC motor and is driven by an engine or DC motor.

In such a hybrid car, recharge and discharge to the battery are repeated frequently. Therefore, the quantity of current data in the recharging direction increases so that this cannot be neglected as an error.

Particularly at the time of regenerative charge during a traveling of a vehicle or generative charge with an alternator, charging current to the battery is not constant (constant voltage charge), so that the correlation between current and voltage is reduced.

That is, the aforementioned method in which each time when 100 (N1) units of data comprised of current value and voltage value of 1 millisecond are collected, those values are averaged so as to obtain average data and then when 100 (N2) units (N1×N2=10000) of this average data are obtained, a remaining capacity is obtained with the obtained current and voltage, cannot be applied to measurement of the remaining capacity of the hybrid car because the correlation therebetween is small when no specific measure is taken.

SUMMARY OF THE INVENTION

The present invention has been achieved in views of the above problems and therefore, an object of the present invention is to provide a battery remaining capacity measuring apparatus capable of measuring a remaining capacity of a battery at a high accuracy in a hybrid car in which recharge and discharge to the battery are repeated frequently.

To achieve the above object, there is provided a battery remaining capacity measuring apparatus comprising: a voltage sensor for detecting a terminal voltage of a battery connected to a load; a current sensor for detecting a current flowing from the battery to the load; a collecting means for collecting a voltage value detected by the voltage sensor and a current value detected by the current sensor every predetermined time; a first determining means for determining whether or not a predetermined number of pairs of the voltage values and the current values are collected; a processing means for when the predetermined number of the plural pairs are collected, averaging the voltage values and the current values respectively so as to obtain a pair of an average voltage value and average current value and repeating the processing for obtaining the pair of the average voltage value and average current value; a second determining means for determining whether or not the processing by the processing means is continued in the shortest time from beginning of discharge from the battery to termination thereof; a means for when it is determined that the processing by the processing means is continued in the shortest time, obtaining a correlation value between voltage and current based on plural pairs of the average voltage values and the average current values; a means for when the correlation value indicates a stronger correlation than a predetermined level, obtaining an approximate line on current-voltage coordinate system based on the plural pairs of the average voltage values and the average current values; and an estimating means for estimating a remaining capacity of the battery by obtaining a corresponding voltage value based on the approximate line and a preliminarily set current value.

According to the present invention, because the battery remaining capacity is measured based on data of the shortest time from beginning of discharge of the battery to termination thereof, even when discharge and recharge to the battery are repeated frequently, an accurate remaining capacity is always obtained. When the data obtaining time is over both the discharge time and recharge time, correlation between a voltage value and a current value weakens so that the remaining capacity cannot be obtained. However a case based on only discharge time data is always generated because the measurement is based on the aforementioned shortest time data.

According to a preferred embodiment of the present invention, the load is hybrid mechanism for assisting a traveling with an engine and a motor and the battery is electrically connected to the motor.

For example, in the hybrid car whose traveling is assisted by an engine and a motor, the battery which is a driving source for that motor repeats discharge and recharge frequently. Even as to a battery in the hybrid car which repeats discharge and recharge frequently, the remaining capacity thereof is able to be meatured accurately.

According to another preferred embodiment of the present invention, where the shortest time is $T_{dc}$(second), a collecting period by the collecting means is $T_{sa}$(second) and the predetermined number of pairs of the voltage values and the current values is N1, a quantity N2 of the plural pairs of the average voltage values and the average current values is obtained according to a following equation;

$$N2 = T_{dc}(\text{second}) / (T_{sa}(\text{second}) \times N1)$$

According to this embodiment, as long as the above equation is satisfied, the collecting period $T_{sa}$ (second) by the collecting means, quantity N1 of the predetermined number of pairs the voltage values and the current values and quantity N2 of plural pairs of the average voltage values and average current values can be determined arbitrarily.

According to still another preferred embodiment of the present invention, the shortest time $T_{dc}$ is 0.8 seconds.

Further, according to still another preferred embodiment of the present invention, the collecting period $T_{sa}$ is 0.001 seconds and the N1 is 8.

The nature, principle and utility of the invention will become more apparent from the following detailed description when read in conjunction with the accompanying drawings.

DESCRIPTION OF THE PREFERRED EMBODIMENTS

Figure 1:
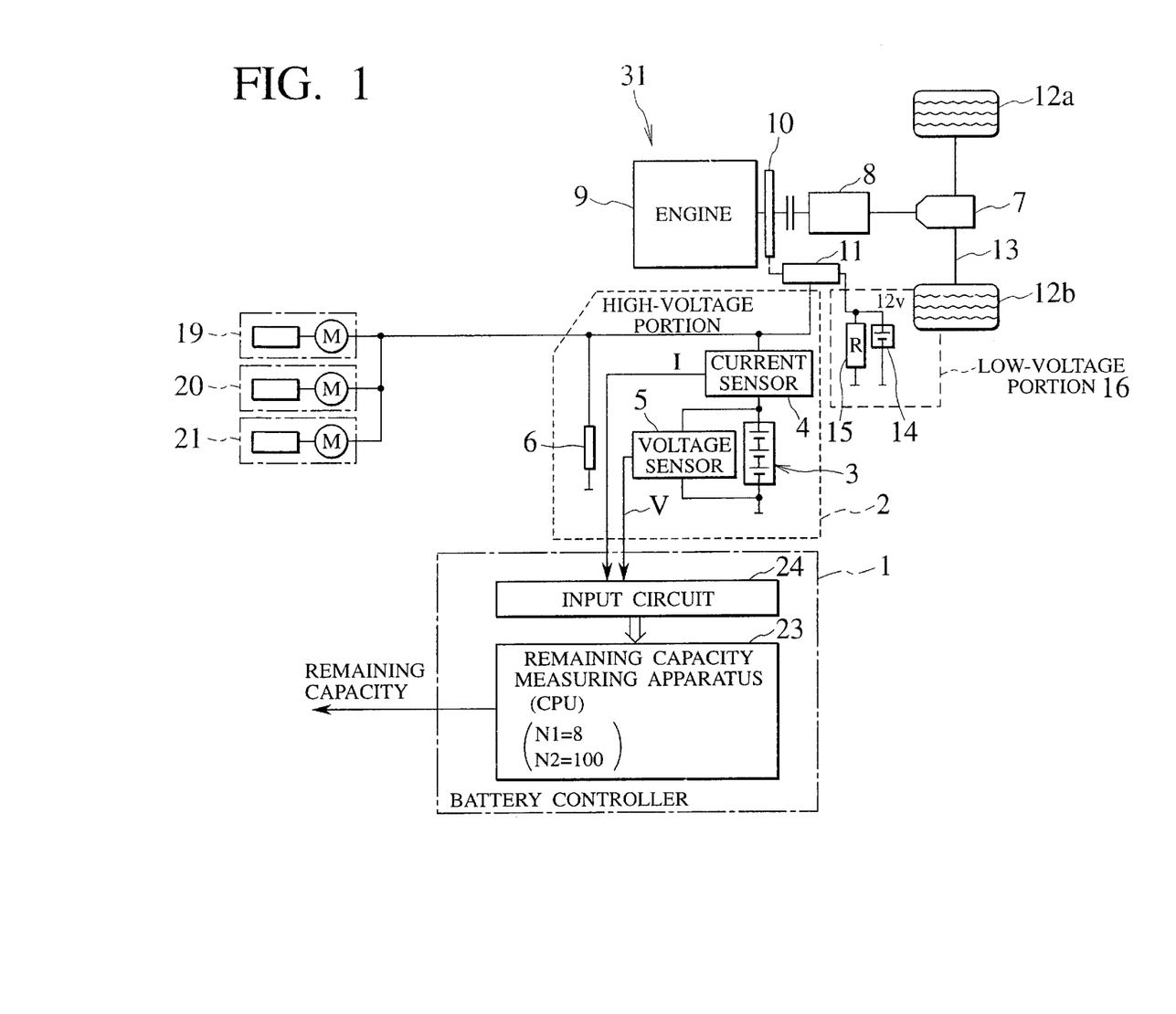
FIG. 1 is a schematic structure diagram of a battery controller and its peripherals of a hybrid car of this embodiment.

FIG. 1 is a schematic structure diagram of a battery controller and its peripherals of a hybrid car of this embodiment.

A battery controller 1 shown in FIG. 1 samples current I and voltage V from a current sensor 4 and a voltage sensor 5 respectively, provided in a high-voltage battery 3 included in a high-voltage portion 2 in order to obtain an accurate remaining capacity without any error using current I and voltage V only at the time of discharge (about 1 second).

As shown in FIG. 1, this high-voltage portion 2 is connected to a hybrid mechanism portion 31 comprising a gear box 8 connected to a transmission 7 for transmitting a driving force to tires 12a, 12b via a shaft 13, an engine 9 connected to this gear box 8, a motor/generator 10 provided between the gear box 8 and engine 9 and a converter 11 for supplying a predetermined power to the motor/generator 10 or converting an electric power from the motor/generator 10 to a predetermined power. More specifically, the battery 3 of the high-voltage portion 2 is connected to the converter 11.

A low-voltage portion 16 comprising a battery 14 of 12V and an output resistor 15 for the battery 14 is connected to the converter 11.

Further, the high-voltage portion 2 contains an output resistor 6 for electric power supply and is electrically connected to a wiper 19, a power window 20, an air conditioner 21 and the like.

The battery controller 1 of this embodiment estimates a remaining capacity using current I and voltage V of the high-voltage battery 3 which supplies an electric power to the hybrid mechanism portion 31 for assisting traveling of a vehicle by means of the battery 3 or is recharged with an electric power sent from the hybrid mechanism portion 31.

As shown in FIG. 1, this battery controller 1 comprises an input circuit 24 for detecting charging current and recharging current of the battery 3 and a terminal voltage at the time of discharge/recharge and converting the detected current and detected voltage to a predetermined level and predetermined width and a remaining capacity measuring apparatus 23 for estimating a remaining capacity using the detected current and detected voltage.

The remaining capacity measuring apparatus 23 (computer) samples current I and voltage V of the battery 3 from the input circuit 24 every 1 millisecond. Each time when eight (N1) units of data comprised of current I and voltage V of 1 millisecond is collected, the current value and voltage value are averaged each. When 100 (N2) unit of data comprised of this averaged current value and voltage value is collected, the 100 data are plotted on voltage-current coordinate system. A correlation coefficient between the current and voltage is obtained based on the plural data plotted on this coordinate system. When a strong negative correlation is indicated, an approximate line (Y=a·X+b Y:current, X:voltage) indicating a relation between voltage and current is obtained. By substituting a predetermined value for Y of this equation, the voltage X is defined, so that a value corresponding to this voltage is specified as a current remaining capacity. That is, when discharge/recharge is repeated, when discharge is started, the remaining capacity is measured using current and voltage for a time lasting at shortest (about 0.8 sec). This reason is that although measurement of the remaining capacity is desired to be based on a number of data measured for as long a time as possible, when the time is infinitely long, data at the time of recharge is also included so that an accurate remaining capacity cannot be obtained.

Figure 2:
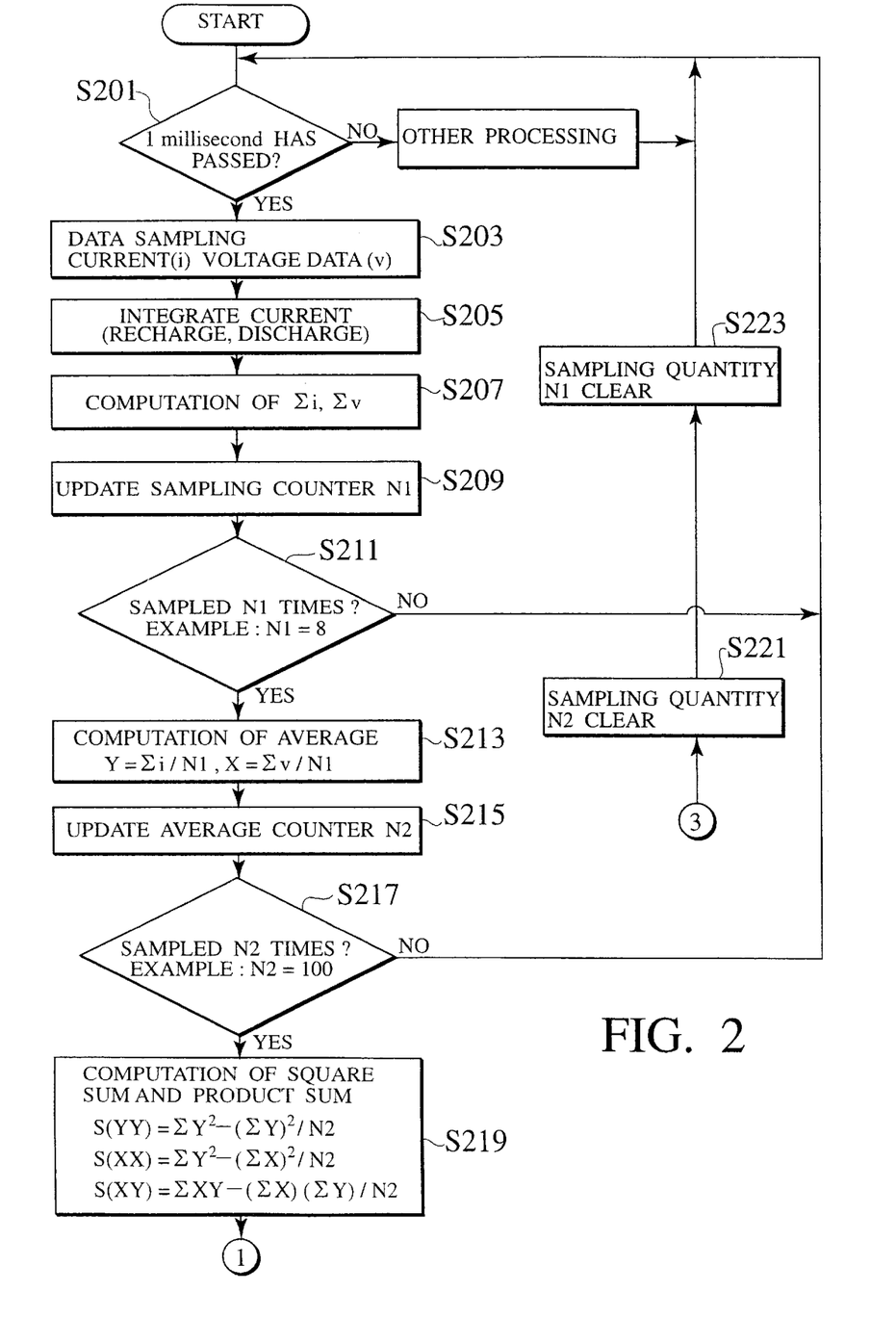
FIG. 2 is a flow chart for explaining an operation of the remaining capacity measuring apparatus.
Figure 3:
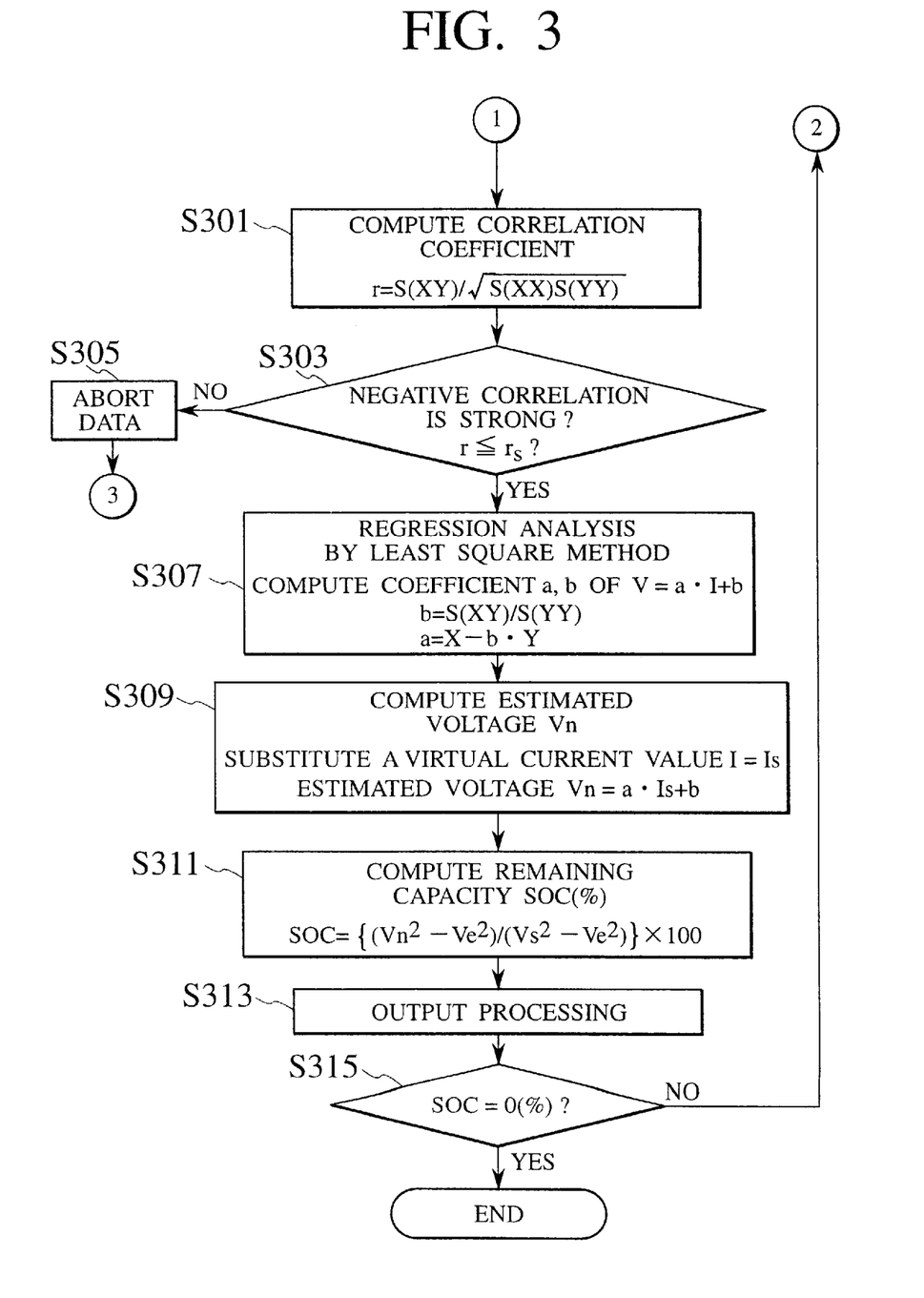
FIG. 3 is a flow chart for explaining an operation of the remaining capacity measuring apparatus.
Figure 4:
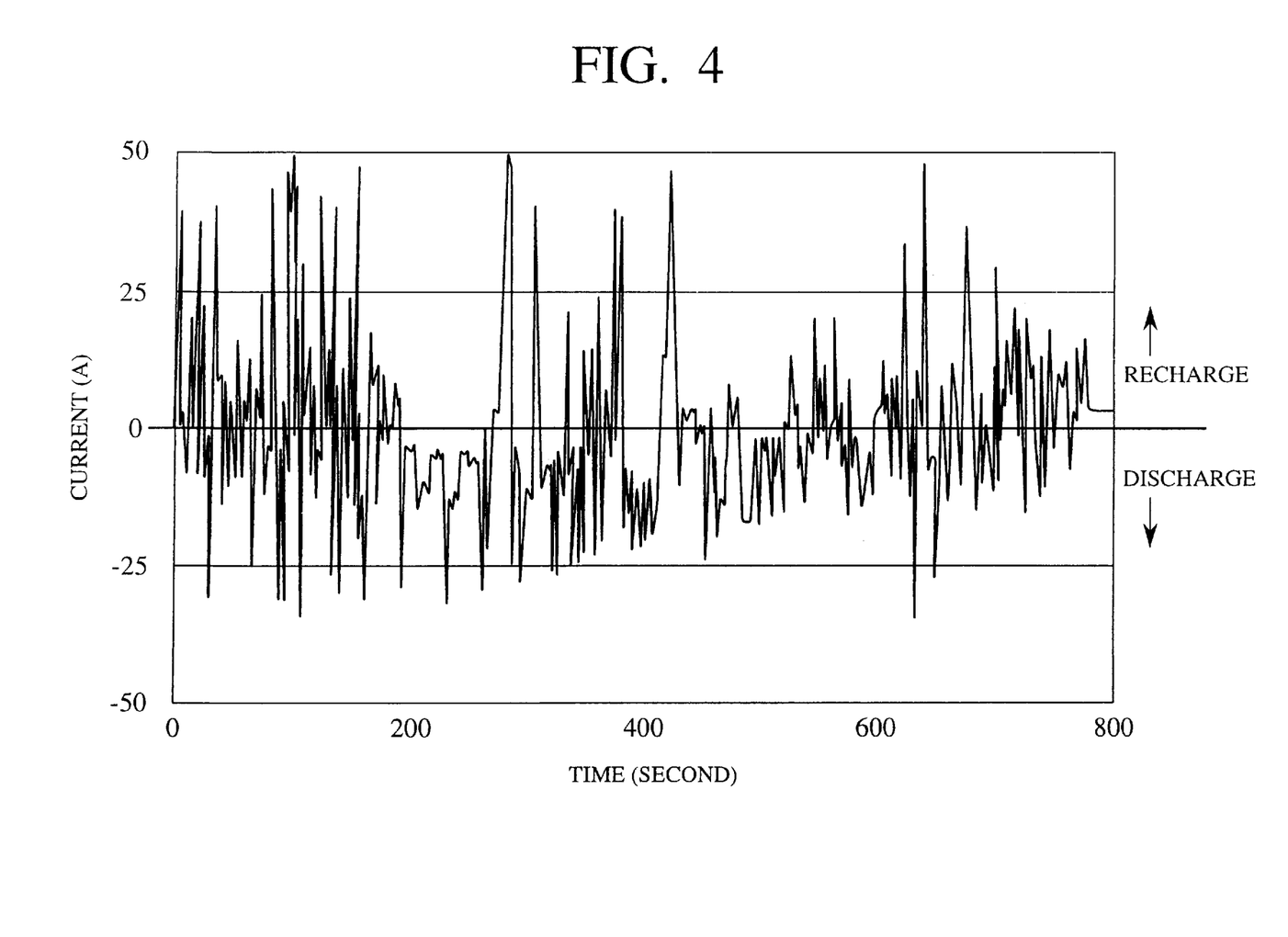
FIG. 4 is a wave form diagram obtained by measuring charge and discharge of the battery for a long time.
Figure 5:
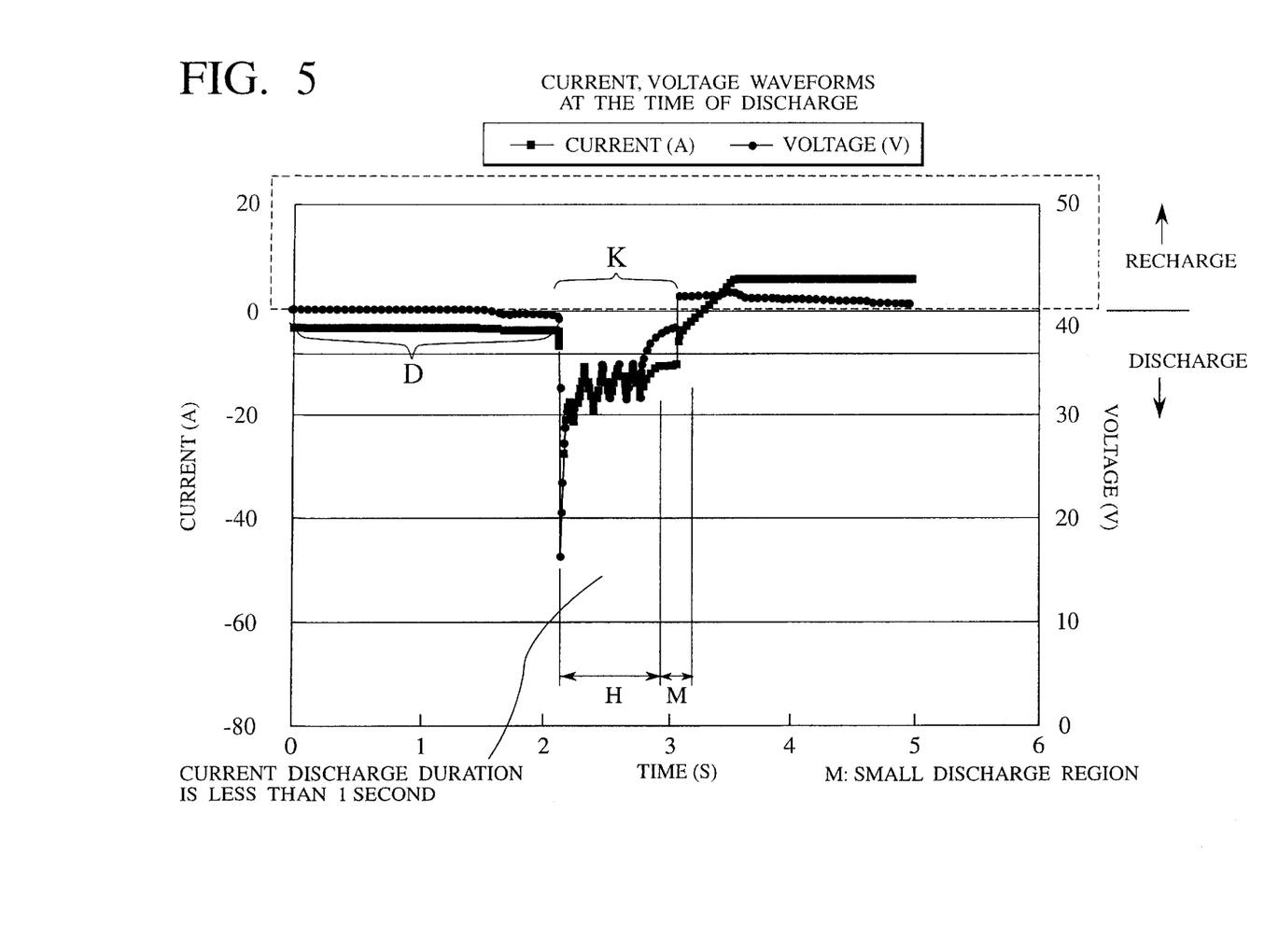
FIG. 5 is an enlarged wave form diagram obtained by magnifying a discharging portion of the wave form shown in FIG. 4.

An operation of the battery controller 1 having such a structure will be described below. FIGS. 2 and 3 are flow charts for explaining an operation of the remaining capacity measuring apparatus 23. FIG. 4 is a wave form diagram obtained by measuring recharge/discharge of the battery 3 connected to the hybrid mechanism portion 31 shown in FIG. 1 for a long time. FIG. 5 is an enlarged wave form diagram in which a discharge portion of the wave form of FIG. 4 is magnified.

First, the reason why N1 is set to eight will be described. Because a traveling of the hybrid car is assisted by both the engine 9 and motor/generator 10, an electric power from the battery 3 is supplied to the motor/generator 10 and during a traveling by an engine, an electric power from the motor/generator 10 is recharged to the battery 3.

Therefore, as shown in FIG. 4, recharge and discharge are repeated frequently during a traveling of the hybrid car.

Discharge indicated by magnifying part of FIG. 4 lasts for about 1 second at shortest (more specifically, 800 millisecond) as shown in FIG. 5. That is, when N1=8 and N2=100 in sampling for every 1 millisecond, the lasting time is 800 millisecond (N1×N2=800). Thus, even when recharge/discharge is repeated frequently, current and voltage can be sampled only for a discharge period.

The remaining capacity measuring apparatus 1 determines whether or not 1 millisecond has passed after a loaded operation signal is inputted (S201).

This loaded operation signal is outputted when for example, an operating amount of an accelerator, speed pulse amount, wiper rotation amount or the like exceeds a predetermined value or air conditioner compressor or the like is exerting switching operation.

Next, when it is determined that 1 millisecond has passed in step S201, current I and voltage V of the battery 3 in the current sensor 4 and voltage sensor 5 are sampled (S203) and then, this current I and time T are multiplied so as to obtain discharge amount and recharge amount (S205). For example, when current from the battery 3 is discharged to the motor/generator 10, this current is discharge current and therefore, discharge current is applied in step S205. When a vehicle is traveling using the engine 9, current from the motor/generator 10 is recharged and therefore, discharge amount is employed in step S205.

Next, the current voltage value and current value are added to the voltage value and current value obtained by previous addition (S209).

Then, the remaining capacity measuring apparatus 1 updates the sampling counter N1 (S209) and determines whether or not the sampling counter N1 counts eight units (S211).

When it is determined that the sampling counter N1 did not count eight units in step S211, the processing is returned to step S201 and then, the current and voltage when 1 millisecond has passed are sampled.

When the sampling counter N1 counts eight units in step S211, each average value of eight current values and eight voltage values are obtained (S213). In this example, the average current is Y and the average voltage is X, and then, each average is obtained based on the equation (1). Then, the obtained average values are plotted on the voltage-current coordinate system.

$$Y = \Sigma i / N1$$
$$X = \Sigma v / N1 \qquad (1)$$

Next each time when the average voltage X and average current Y are obtained, the remaining capacity measuring apparatus 1 updates the average counter N2 (S215) and determines whether or not this average counter N2 counted 100 units (S217). In sampling of every 1 millisecond, whether or not every eight currents and voltages are averaged each is determined about 800 units thereof.

When it is determined that the average counter N2 did not count 100 units in step S217, the processing is returned to step S201.

When it is determined that the average counter N2 reached 100 units in step S217, each square sum and product sum are obtained as shown in the equation (2) (S219).

$$S(YY) = \Sigma Y^2 - (\Sigma Y)^2 / N2$$
$$S(XX) = \Sigma X^2 - (\Sigma X)^2 / N2$$
$$S(XY) = \Sigma XY - (\Sigma X)(\Sigma X) / N2 \qquad (2)$$

When it is determined that 1 millisecond has not passed in step S201, other processing such as a processing for sending current data, voltage data and the like obtained during measurement of the remaining capacity is carried out (S225).

Figure 6:
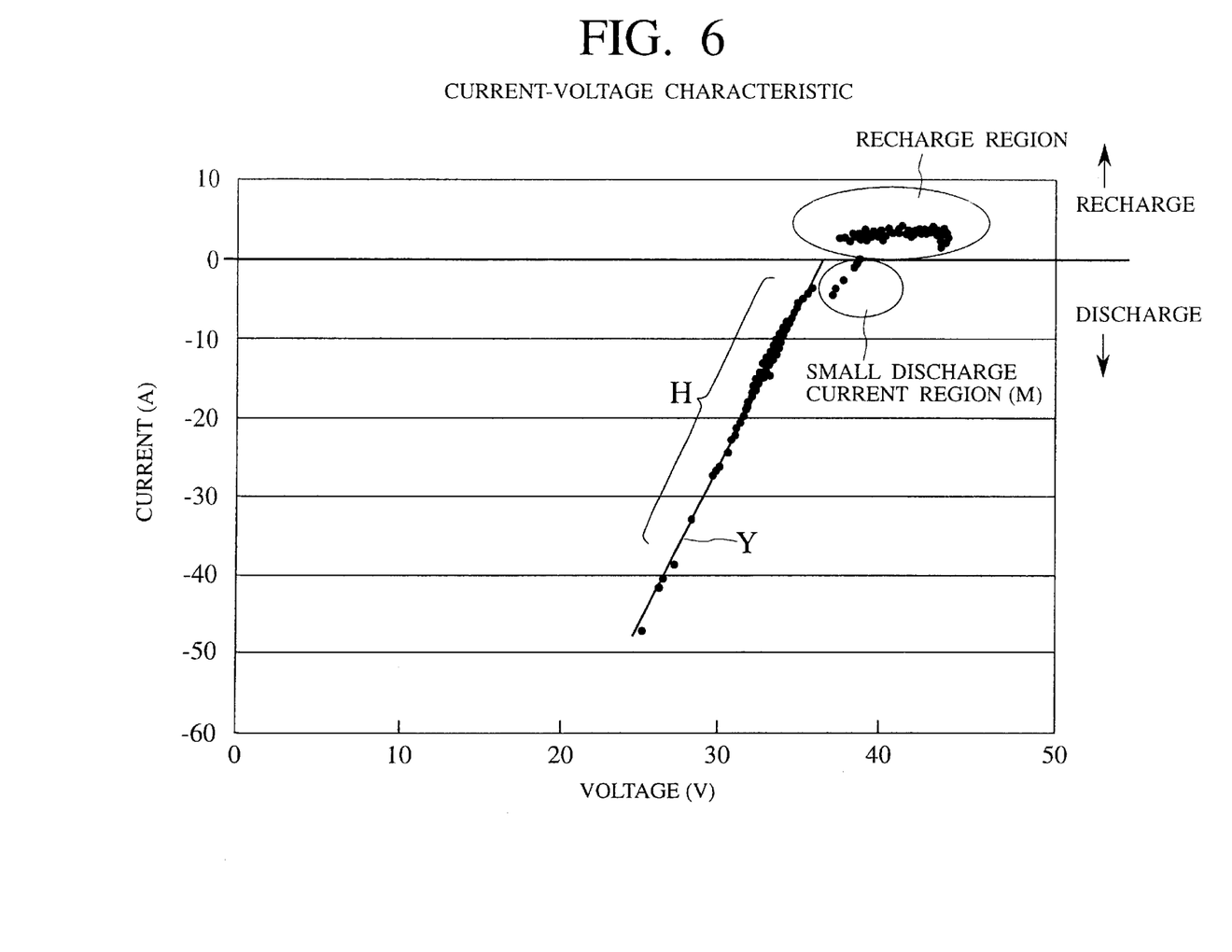
FIG. 6 is an explanatory diagram for explaining voltage-current characteristic according to this embodiment.

That is, as shown in FIG. 6, dispersion of current to voltage data is expressed on the current-voltage coordinate system by the processing up to step S219. Meanwhile, in FIG. 6, current is expressed on ordinate and voltage is expressed on abscissa.

FIG. 6 indicates that there are small discharge current region M and large discharge current region H. This reason is that as shown in FIG. 5, a large current flows in the initial period of discharge. An accurate approximate line can be obtained using current-to-voltage data in the large current region H.

Next, as shown in FIG. 3, the remaining capacity measuring apparatus 1 obtains a correlation coefficient r using data obtained in step S219 based on the equation (3) (S301).

$$r = \frac{S(XY)}{\sqrt{S(XX)S(XY)}} \qquad (3)$$

By comparing this correlation coefficient r with a preliminarily set up reference correlation coefficient $r_s$, whether or not the correlation coefficient r indicates a strong negative correlation is determined (S303).

When it is determined that the correlation is low in step S303, the sampled current data and voltage data and average data are aborted (S305) so as to clear the current N2 as shown in FIG. 2 (S221). At the same time, the current N1 is cleared (S223) and the processing is returned to step S201.

When current and voltage in the linear region D shown in FIG. 5 are sampled or data over both the linear region D and discharge region k of 800 millisecond are sampled in the processings from step S301 to step S305, it is determined that negative correlation is low in the processing of step S303.

However, when data in the discharge region k (region H) is sampled, a strong negative correlation is indicated. That is, when eight data sampled every 1 millisecond are averaged, 100 units of this averaged data are collected and indicates a strong negative correlation, it comes that voltage-current characteristic data based on current, voltage data in the discharge region k of FIG. 5 is obtained.

Then, when it is determined that a strong negative correlation is indicated in step S303, current-voltage approximate linear function (V=a·I+b) is obtained based on the equation (4) according to least square method (S307).

$$V = a \cdot I + b$$
$$b = S(XY) / S(YY)$$
$$a = X - b \cdot Y \qquad (4)$$

Next, by substituting virtual current value Is (for example, −10A) for the equation (4), a current voltage of the battery 3 is estimated (S309) and a remaining capacity SOC is obtained according to the equation (5) (S311). Then, an output processing for sending this remaining capacity SOC to a display unit is carried out (S313).

$$SOC = \{(Vn^2 - Ve^2)/(Vs^2 - Ve^2)\} \times 100 \qquad (5)$$

where:
  Vs: fully charged voltage
  Vn: estimated voltage
  Ve: discharge termination voltage Next, whether or not the obtained remaining capacity SOC is 0% is determined (S315). When the remaining capacity SOC is 0%, this processing is terminated. When the remaining capacity is more than 0%, the processing is returned to step S201 through steps S221 and S223 and sampling is carried out every 1 millisecond to perform the above processing again.

Although in the above embodiment, the remaining capacity of the battery 3 connected to the hybrid mechanism portion 31 is obtained, it is permissible to obtain the remaining capacity of the battery 14 provided in a low voltage portion.

When a cell motor of the wiper 19, power window 20, air conditioner 21 is rotating or a head lamp, rear defogger or the like (not shown) is turned on, current flows from the battery and then, the remaining capacity measuring apparatus 1 of this embodiment measures a remaining capacity at that time.

Therefore, although, conventionally, the remaining capacity measuring apparatus is restricted to measurement of the remaining capacity of a battery of an electric vehicle whose battery discharge is relatively long hour, it is suitable for measurement of the remaining capacity of a battery whose recharge/discharge is carried out frequently like a hybrid car (including a high voltage vehicle) under development in recent years.

According to the present invention, each time when the quantity N1 becomes eight, the measured current value and voltage value are averaged and the averaged values are plotted on the voltage-current coordinate system. Each time when the quantity N2 of this averaged data becomes 100, a correlation coefficient is obtained and when the correlation coefficient indicates a strong negative correlation, a remaining capacity is measured.

According to this method, when voltage and current in a section over both the recharge interval and discharge interval are collected every predetermined time and each time when the quantity N1 are collected, a correlation of N2 data of averaged current and voltage is obtained, the correlation is low and this data is aborted.

However, when voltage and current in only the discharge interval are collected every predetermined time and each time when the quantity N1 are collected, a correlation of N2 data of averaged current and voltage is obtained, these data indicate a strong correlation.

That is, even in the hybrid car (including a high voltage application vehicle) in which recharge and discharge are repeated frequently, the remaining capacity can be estimated with only data in the discharge interval. Thus, a highly accurate remaining capacity can be obtained.

Although in the above described embodiment, it is specified that N1 is 8 and N2 is 100, these values may be determined arbitrarily. For example, when the shortest lasting duration after discharge starts is 0.8 seconds, if the sampling period is 1 millisecond and 100 pairs of averaged voltage data and averaged current data are required, each time when eight of voltage values and current values are sampled, these sampled values may be averaged. That is, when the sampling period is $T_{SA}$ and the shortest duration after discharge starts is $T_{dc}$, the equation (6) only needs to be established.

$$T_{SA}(\text{second}) \times N1 \times N2 = T_{dc}(\text{second}) \tag{6}$$

It should be understood that many modifications and adaptations of the invention will become apparent to those skilled in the art and it is intended to encompass such obvious modifications and changes in the scope of the claims appended hereto.

What is claimed is:

1. A battery remaining capacity measuring apparatus comprising:

a voltage sensor for detecting a terminal voltage of a battery connected to a load;

a current sensor for detecting a current flowing from the battery to the load;

a collecting means for collecting a voltage value detected by the voltage sensor and a current value detected by the current sensor every predetermined time;

a first determining means for determining whether or not a predetermined number of pairs of the voltage values and the current values are collected;

a processing means for when the predetermined number of the plural pairs are collected, averaging the voltage values and the current values respectively so as to obtain a pair of an average voltage value and average current value and repeating the processing for obtaining the pair of the average voltage value and average current value;

a second determining means for determining whether or not the processing by the processing means is continued in the shortest time from beginning of discharge from the battery to termination thereof;

a means for when it is determined that the processing by the processing means is continued in the shortest time, obtaining a correlation value between voltage and current based on plural pairs of the average voltage values and the average current values;

a means for when the correlation value indicates a stronger correlation than a predetermined level, obtaining an approximate line on current-voltage coordinate system based on the plural pairs of the average voltage values and the average current values; and an estimating means for estimating a remaining capacity of the battery by obtaining a corresponding voltage value based on the approximate line and a preliminarily set current value.

2. A battery remaining capacity measuring apparatus according to claim 1 wherein the load is hybrid mechanism for assisting a traveling with an engine and a motor and the battery is electrically connected to the motor.

3. A battery remaining capacity measuring apparatus according to claim 1 wherein where the shortest time is $T_{dc}$(second), a collecting period by the collecting means is $T_{sa}$(second) and the predetermined number of pairs of the voltage values and the current values is N1, a quantity N2 of the plural pairs of the average voltage values and the average current values is obtained according to a following equation;

$$N2 = T_{dc}(\text{second})/(T_{sa}(\text{second}) \times N1).$$

4. A battery remaining capacity measuring apparatus according to claim 3 wherein the shortest time $T_{dc}$ is 0.8 seconds.

5. A battery remaining capacity measuring apparatus according to claim 4 wherein the collecting period $T_{sa}$ is 0.001 seconds and the N1 is 8.

* * * * *

UNITED STATES PATENT AND TRADEMARK OFFICE
CERTIFICATE OF CORRECTION

PATENT NO.    : 6,201,373 B1
DATED         : March 13, 2001
INVENTOR(S)   : Youichi Arai et al.

It is certified that error appears in the above-identified patent and that said Letters Patent is hereby corrected as shown below:

<u>Title page,</u>
Item [75], Inventors, "Youchi" should read -- Youichi --.

Signed and Sealed this

Second Day of April, 2002

Attest:

Attesting Officer

JAMES E. ROGAN
*Director of the United States Patent and Trademark Office*